(12) United States Patent
Vetter (10) Patent No.: US 7,562,444 B2
(45) Date of Patent: Jul. 21, 2009

(54) METHOD FOR MANUFACTURING A CPU COOLING ASSEMBLY

(75) Inventor: Stephan Michael Vetter, Lockport, NY (US)

(73) Assignee: Delphi Technologies, Inc., Troy, MI (US)

( * ) Notice: Subject to any disclaimer, the term of this patent is extended or adjusted under 35 U.S.C. 154(b) by 868 days.

(21) Appl. No.: 11/221,526

(22) Filed: Sep. 8, 2005

(65) Prior Publication Data

US 2007/0050980 A1    Mar. 8, 2007

(51) Int. Cl.
*H05K 3/30* (2006.01)
(52) U.S. Cl. .............................. 29/832; 29/825; 29/840
(58) Field of Classification Search .................. 29/825, 29/832, 840
See application file for complete search history.

(56) References Cited

U.S. PATENT DOCUMENTS

| | | | |
|---|---|---|---|
| 5,388,635 A | 2/1995 | Gruber et al. ............... | 165/80.4 |
| 7,231,961 B2 * | 6/2007 | Alex et al. .................. | 165/80.4 |
| 2004/0182548 A1 | 9/2004 | Lovette et al. .............. | 165/103 |
| 2005/0199372 A1 | 9/2005 | Frazer et al. ................ | 165/170 |
| 2005/0217829 A1 * | 10/2005 | Belits et al. ............ | 165/104.33 |
| 2005/0263273 A1 | 12/2005 | Crumly ...................... | 165/170 |
| 2006/0215364 A1 * | 9/2006 | Le .............................. | 361/695 |

* cited by examiner

*Primary Examiner*—C. J Arbes
(74) *Attorney, Agent, or Firm*—Patrick M. Griffin (57) ABSTRACT

A CPU cooling assembly includes a copper cold plate in which a pattern of ultra thin fins and channels are formed, and a copper manifold-cover in which a series of alternating inlet and outlet channels are formed, at right angles to the fin pattern. The manifold cover is sealed to the cold plate by a resistance welding technique that melts and closes up a perimeter welding seam just as the bottom edges of the manifold channels lightly engage the top edges of the micro fins. The result is a fully sealed assembly in which the channels and fins form an effective, very finely divided and regular checker board flow pattern for a suitable cooling fluid, with no deformation or clogging of the ultra thin flow channels.

5 Claims, 10 Drawing Sheets

METHOD FOR MANUFACTURING A CPU COOLING ASSEMBLY

TECHNICAL FIELD

This invention relates to CPU cooling assemblies in general, and specifically to a method of manufacturing such an assembly by resistance welding.

BACKGROUND OF THE INVENTION

As computer processing units (CPU's) become more powerful, compact and dense, they also run hotter, and require more efficient cooling. Air cooling is not sufficient for the newer generations of CPU's, and forced liquid cooling has been proposed, and is already being used in some cases, as an alternative. In one simple design of a so called cooling block, a conductive metal cold plate has a smooth undersurface, and a generally finned or otherwise surface area enhanced upper surface. The CPU is thermally joined to the cold plate smooth undersurface, by a compliant conductive paste, and a simple box shaped manifold is sealed over the upper surface of the cold plate. Liquid coolant is pumped into and out of the box manifold, and flows freely over and around the fins or other surface area enhancements of the cold plate to extract heat. No particular provision is made to guide or control the liquid flow over the cold plate upper surface.

Another variation in liquid cooling uses a metal cold plate (or cold sheet) which is extremely thin, and in which the fins or micro channels cut into its upper surface are also extremely fine, created by chemical etching or laser cutting. Instead of simply attaching a box shaped manifold above and over the finned upper surface, the liquid flow is guided and forced directly down into and through the fins-channels in a branched, hierarchical flow. This is achieved by sealing a manifold with at least one tier of inlet and outlet channels tightly down over and perpendicularly crossing the micro fin-channel pattern, so that flow is forced into an even and regularized checkerboard pattern. This forced and very finely distributed liquid flow is more effective and efficient in heat extraction. In order for the regularized liquid flow to occur, however, the sealing of the manifold down over the top edges of the fin pattern must be tight and complete, to prevent and flow from short circuiting or by passing the channels, which would disrupt the otherwise forced regularity of the flow pattern.

A detailed disclosure of the micro channel, checkerboard flow design may be found in the now expired U.S. Pat. No. 5,388,635 to Gruber et al. As disclosed there, a micro channeled metal cold sheet has a single or multi tiered rubber or plastic manifold vulcanized to its upper surface, and one or more CPU's thermally bonded to its lower surface. As a practical matter, it would likely be very difficult to successfully vulcanize a compliant, rubber manifold over the extremely fine channels involved without clogging at least some of the channels. Using a hard, non compliant material for the manifold instead, one unlikely to protrude into or clog any of the channels would present its own problems, however. The multiple crossing interfaces between the bottom edges of the manifold channels and top the edges of the cold sheet micro channel-fins would have to be held to very close tolerances, so that any gap would be minimized, and whatever sealing material (solder, braze cladding, adhesive, etc) that was used to fill and seal even a small gap would also be liable to run into and clog the very small micro channels.

SUMMARY OF THE INVENTION

The subject invention provides a novel combination of product features and method steps that allow a micro channel, checkerboard flow type CPU cooling assembly to be manufactured and assembled economically; with an assurance of tight interface sealing that prevents by pass flow, but without clogging or jeopardizing the flow in the micro channels.

In the preferred embodiment disclosed, a base cold plate of thermally fusible and electrically conductive material (pure copper), has a flat lower surface adapted for thermal bonding to a CPU or similar electronic component to be cooled. The cold plate upper surface is surrounded an exterior perimeter to be sealed, which, in the embodiment disclosed, is a short cylindrical flange integral with the cold plate itself. The top edge of the cylindrical flange includes a shorter, integral knife edged welding seam. The cold plate upper surface also has a series of parallel, ultra fine micro channels cut into its surface. The metal material left between the micro channels can be conceptualized as ultra thin micro fins, with upper edges flush to the basic upper surface of the cold plate itself. Near the center of the micro channel pattern, several of the channel-fins extend all the way out to the perimeter flange, at each end.

A manifold formed of the same material as the cold plate comprises a series of parallel, alternating inlet-outlet channels, formed, in the embodiment disclosed, by a continuous, sinuous wall that extends between a pair of solid end blocks. The manifold channels are relatively wider than the base plate micro channels. The end blocks each include a central sealing rib that is flush to the lower surface of the sinuous wall, while the rest of the lower surface of the end blocks is slightly recessed. The outer edges of the manifold end blocks closely match the inner surface of the cold plate's cylindrical flange. When the manifold is laid onto the cold plate upper surface, the inlet outlet channels perpendicularly cross the micro channels, in a checkerboard pattern. The undersurfaces of the sealing ribs extend parallel to the longer, central micro fins in the pattern.

A last component is a cover of the same material as the cold plate and manifold, an undersurface of which closely and continuously engages the welding seam on the upper edge of cylindrical flange of the cold plate when the cover is clamped down over the cold plate. Enough continual clamping pressure is applied to maintain good electrical contact between the cover undersurface and welding seam, and sufficient electrical current is applied across the two to begin to melt the thin welding seam. As this occurs, the sandwich of cold plate-manifold-cover begins to close up slightly until the undersurface of the cover solidly engages the upper edge of the flange, as the melted welding seam creates a tight and continuous perimeter seal. The thickness of the manifold relative to the interior thickness of the cold plate cylindrical flange (plus welding seam) is determined such that, just as the cover touches down on the upper edge of the flange, the lower surface of the manifold sinuous wall simultaneously touches the upper edges of the micro fins (at multiple, discrete perpendicular junctions). Concurrently, the lower surfaces of the raised sealing ribs engage the upper edges of the longer, central micro fins (at a parallel, continuous junction), with just enough pressure, and over just enough elapsed time, to quickly create a solid, but non obstructing, juncture at various interfaces. Liquid coolant forced into the inlet channels of the manifold is then forced down into the micro channels and back up into the outlet channels consistently, and cannot by pass or short circuit past the end blocks of the manifold because of the solid seal of the sealing ribs fused to the upper edges of the longer, central micro fins.

BRIEF DESCRIPTION OF THE DRAWINGS

These and other features of the invention will appear from the following written description, and from the drawings, in which.

DESCRIPTION OF THE PREFERRED EMBODIMENT

Figure 1:
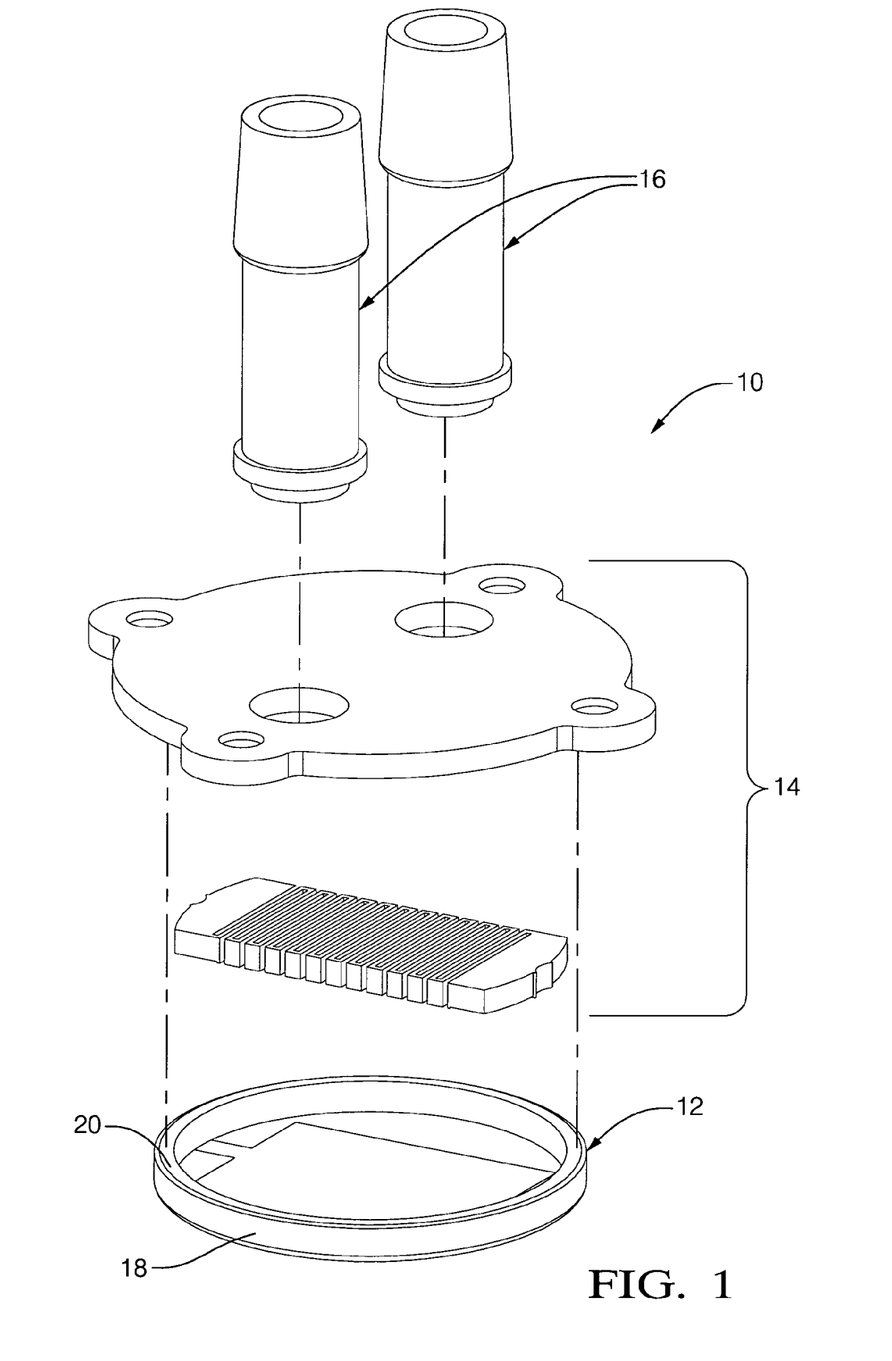
FIG. 1 is a perspective view of the various components of the cooling assembly exploded.

Referring first to FIG. 1, the CPU cooling assembly of the invention, a preferred embodiment of which is indicated generally at 10, includes two basic components, a base cold plate, indicated generally at 12, and a manifold-cover, indicated generally at 14. In addition, identical inlet-outlet pipes, indicated generally at 16, are formed of the same material and incorporated into the same basic assembly process, which is a practical convenience. All components are manufactured of a material, such as highly pure, oxygen free copper that is both electrically and thermally conductive, and capable of good resistance welding. Besides the suitable material, the components incorporate structural features of a shape and relative size that enable the resistance welding process described below.

Figure 2:
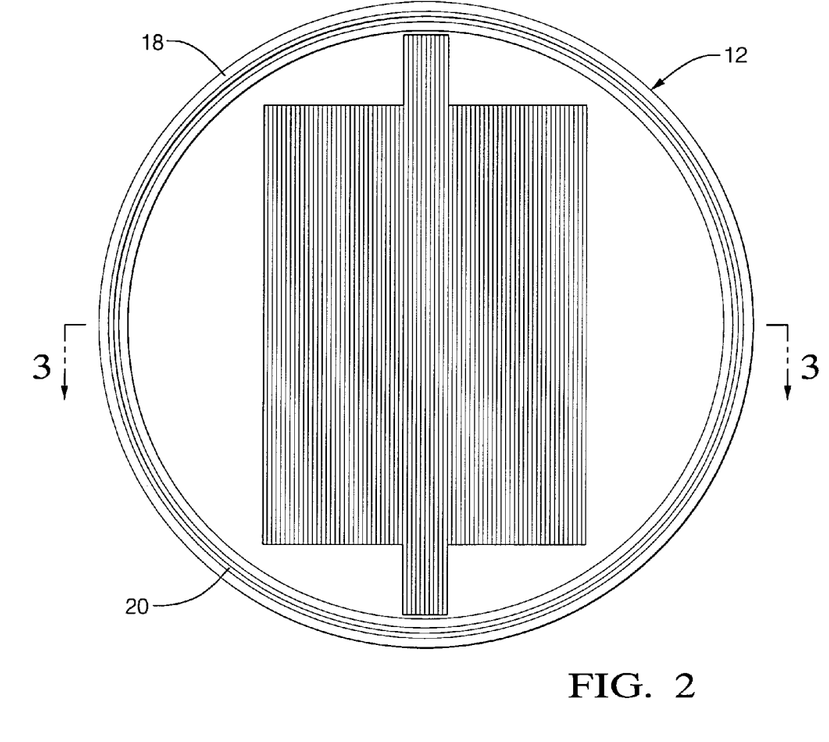
FIG. 2 is a plan view of the inside and upper surface of the base cold plate.
Figure 3:
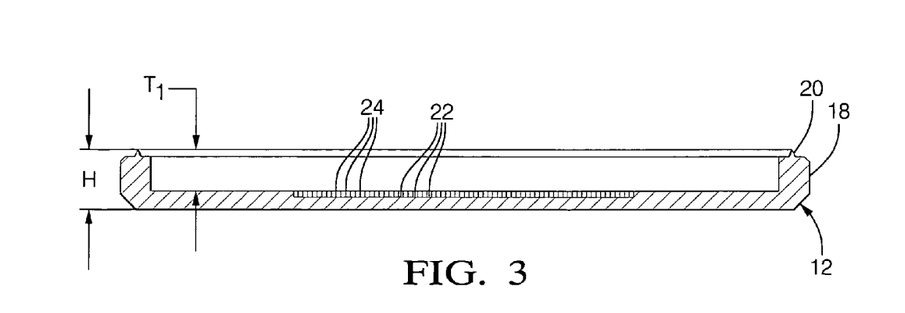
FIG. 3 is an enlarged cross section of the base cold plate taken along the line 3-3 of FIG. 2.

Referring next to FIGS. 2 and 3, a circular base cold plate 12 is approximately 34 mm in outer diameter with a thickness of approximately 1.0 mm and a perimeter cylindrical flange 18 approximately 2.8 mm in total height H. The top edge of flange 18 has a central, coaxial, and integrally formed welding seam 20, which is approximately 0.4 mm tall, and equally wide at the base. The total "interior thickness" T1 of cold plate 12, from its inner surface to the upper edge of welding seam 20, is approximately 2.1 mm, which is not significant in absolute terms, but which is significant relative to the thickness of another component, described below. The circular form of base plate 12 allows seam 20 to be formed by a lathe turning operation, if desired, although it could also be formed by laser cutting or other technique. The bottom surface of cold plate 12 is machined to a high degree of flatness, to enable its thermal bonding to the upper surface or "lid" of a CPU or similar electronic component. The upper, inner surface of cold plate 12 is laser cut (or chemically or otherwise etched) with a parallel series of micro channels 22—micro fins 24. The channels 22 are approximately 350 to 450 microns deep, and are extremely narrow, approximately 60 microns, while the fins 24 between are even narrower, approximately 50 microns; foil like, in effect. The benefit of such a dense pattern of extremely thin structures is the potential for very efficient heat transfer as a liquid is pumped through them. While laser cutting and other processes are capable of forming such narrow structures, there is difficulty in sealing or fusing another structure to them afterward, without damage, deformation or clogging. Most of the fin-channel pattern is confined to a rectangular pattern measuring approximately 17 by 24 mm. At the center, however, an approximate 8.5 mm width of channels 22—fins 24 extends all the way out to the inner surface of flange 16.

Figure 4:
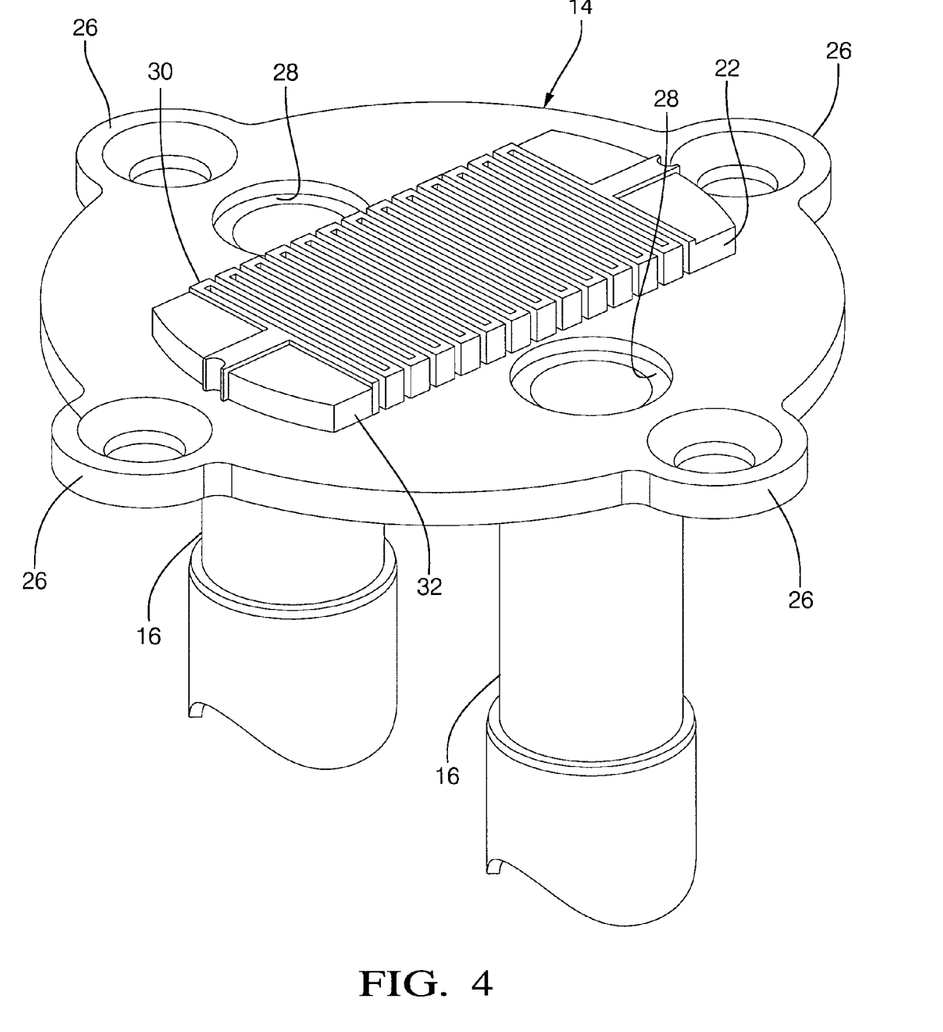
FIG. 4 is a perspective view of the bottom of the manifold and cover, shown as an integral part.
Figure 5:
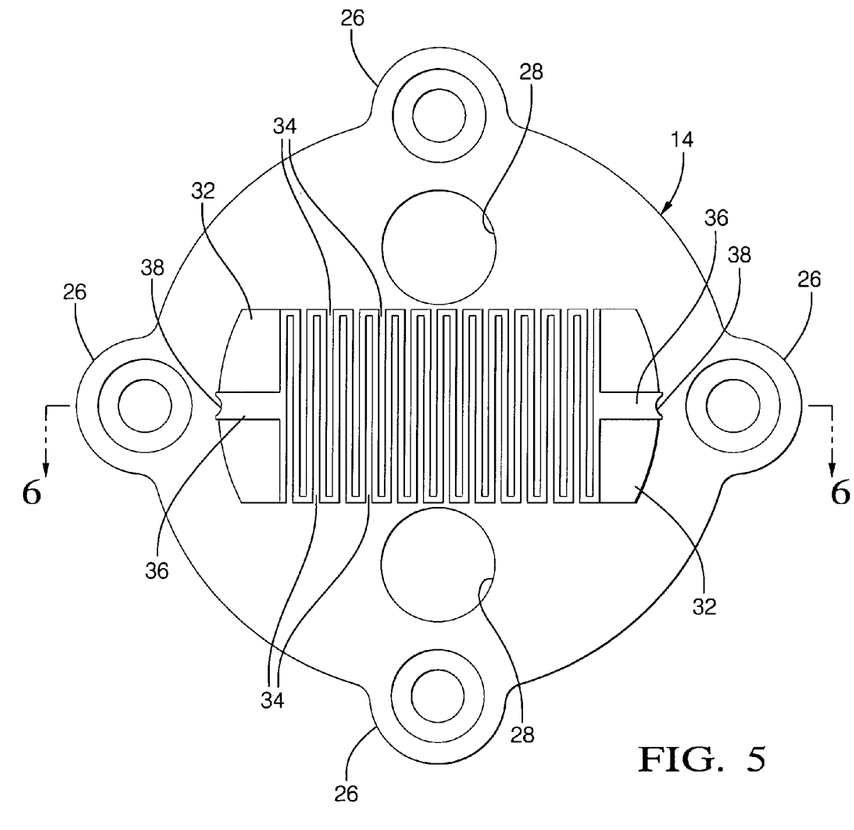
FIG. 5 is a plan view of the bottom of the manifold-cover.
Figure 6:
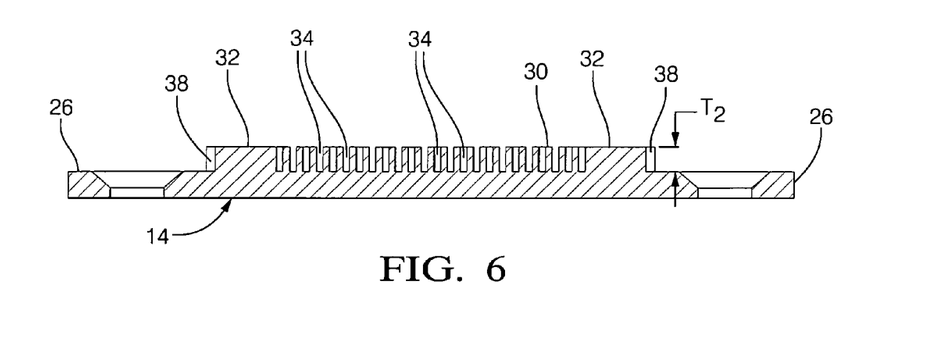
FIG. 6 is a cross section of the manifold cover taken along the line 6-6 of FIG. 5.

Referring next to FIGS. 4-6, manifold-cover 14 is formed of the same copper material, approximately 2 mm thick, and with a larger outer diameter of approximately 42 mm, so as to be capable of overlaying and overlapping the edge of base plate flange 18. Four pierced lobes 26 allow the entire assembly 10 to be later clamped to a CPU or similar component to be cooled. A pair of inlet-outlet apertures 28 is provided for the inlet-outlet pipes 16. Intermediate the apertures 28, an inlet-outlet manifold is comprised of a sinuous wall 30 that extends between two solid end blocks 32. The sinuous wall 30 occupies a rectangular pattern approximately 14 by 21 mm, just slightly smaller than the pattern occupied by the base plate micro channels, and is approximately 0.44 mm wide. The most significant dimension of wall 30, relative to the method of the invention, is the relationship of its thickness T2 relative to the undersurface of cover 14, approximately 1.8 mm, to the interior thickness T1 of the base plate 12 described above (approximately 2.1 mm), as will be described above. The benefit of the continuous, sinuous shape of wall 30 is that it naturally forms a regular pattern of side by side inlet and outlet channels 34, closed and open at alternate ends, and of a comparable width of approximately 0.50 mm. While wall 30 is thin, it is still an order of magnitude thicker than the micro channel pattern, and is amenable to being formed integrally with the manifold-cover 14 by a more cost effective method, such as die casting or water jet cutting. The end blocks 32 have arcuate outer edges that closely match the inner surface of cylindrical flange 16. The surfaces of end blocks 32 are recessed approximately 40 microns to create a pair of discrete central sealing ribs 36, approximately 1.5 to 2 mm wide, flush to the lower edges of the manifold channels 34 (sinuous wall 30). In the embodiment disclosed, the arcuate outer edges of the end blocks 32 are formed with discrete barbed notches 38, which provide a function described below. As disclosed, the end blocks 32 and sinuous wall 30 that form the manifold are integral to the single component 14, but could, conceivably, be formed separately, as is shown in FIG. 1, especially if it was desired to use two different materials. This would create another interface to be sealed, between the upper surface of the manifold, and the bottom surface of the cover. However, that interface would not be nearly as difficult to seal as that between the lower edges of the wall 30 and upper edges of the fins 24, and could likely be done with adhesive or solder, without deforming or clogging any part of either component.

Figure 7:
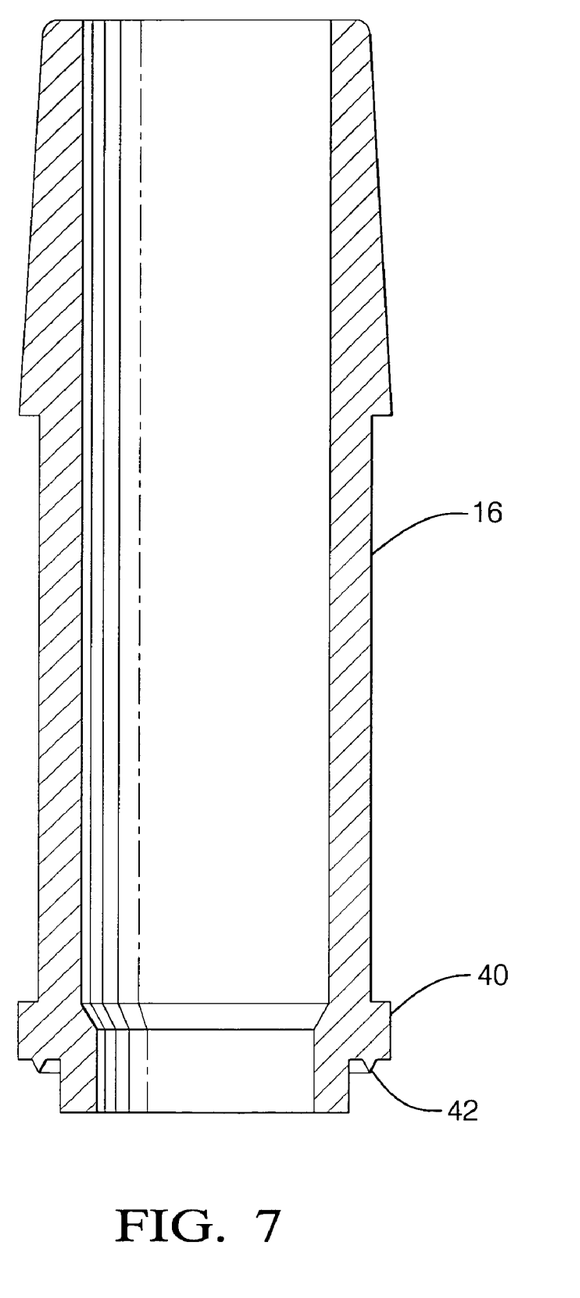
FIG. 7 is a cross section of an inlet-outlet pipe.

Referring next to FIG. 7, inlet-outlet pipes 16 are also conveniently formed of the same copper as the other components, and are thus amenable to incorporation in the same assembly process. Each identical pipe 16 is basically a cylindrical tube, with a stepped lower socket 40 that fits closely into a corresponding cover aperture 28. A similar welding seam 42 concentric to socket 40 engages the perimeter surface of aperture 28, and is also conveniently capable of being formed by the same kind of lathe machining or other operation.

Figure 8:
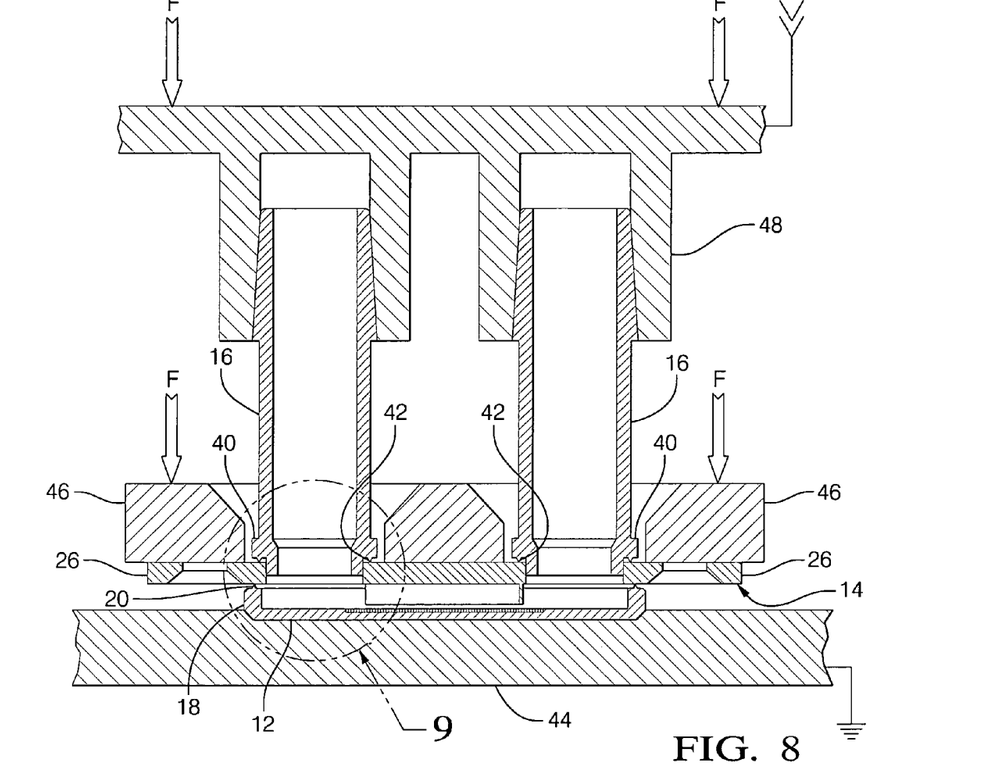
FIG. 8 is a cross section of the base cold plate, manifold-cover and inlet and outlet pipes assembled and clamped prior to welding.
Figure 9:
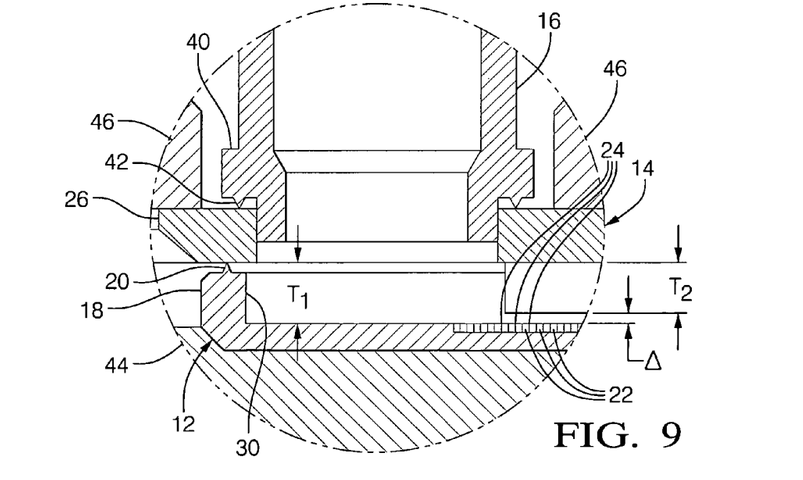
FIG. 9 is an enlarged, circled section of FIG. 8, prior to current being applied.

Referring next to FIGS. 8 and 9, the components described in detail above are shown clamped and fixtured in place prior to the resistance welding operation that fuses them together. Of course, all terms such as "lower" and "upper" are arbitrarily and idiosyncratically applicable to the particular orientation of the drawing, and should be read as such. Regardless of orientation, the components will have edges which face each other, and which are engaged with each other in an effective manner according to the invention. A lower clamp 44 engages the bottom of cold plate 12, and an upper clamp 46 engages the top of cover 14, squeezing the two together with a suitable constant force mechanism, such as a spring, to create a continual clamping force of approximately 20 to 50 inch pounds. When so clamped, as best seen in FIG. 9, the relation of T1 and T2 described above creates a gap A between the lower edge of manifold wall 30 and the upper edges of the fin pattern 24 that is approximately 5 microns less than the height of the welding seam 20. In effect, the welding seam 20 acts to hold the upper edges of the fins 24 away from the crossing lower surfaces of the manifold channels 34, in the pre weld configuration, with a gap that is just under the height of welding seam 20. Upper electrodes 48 engage the tops of the inlet-outlet pipes 16, to apply one pole of a suitable voltage, while a lower electrode (not illustrated) would apply an opposite pole to base plate 12. A relatively low voltage with a relatively high current can achieve the weld, in the case of a highly conductive material such as pure copper. For example, twelve volts applied across the components should be sufficient to melt the seams 20 and 42, so as to enable the welding and joining action described in greater detail next.

Figure 10:
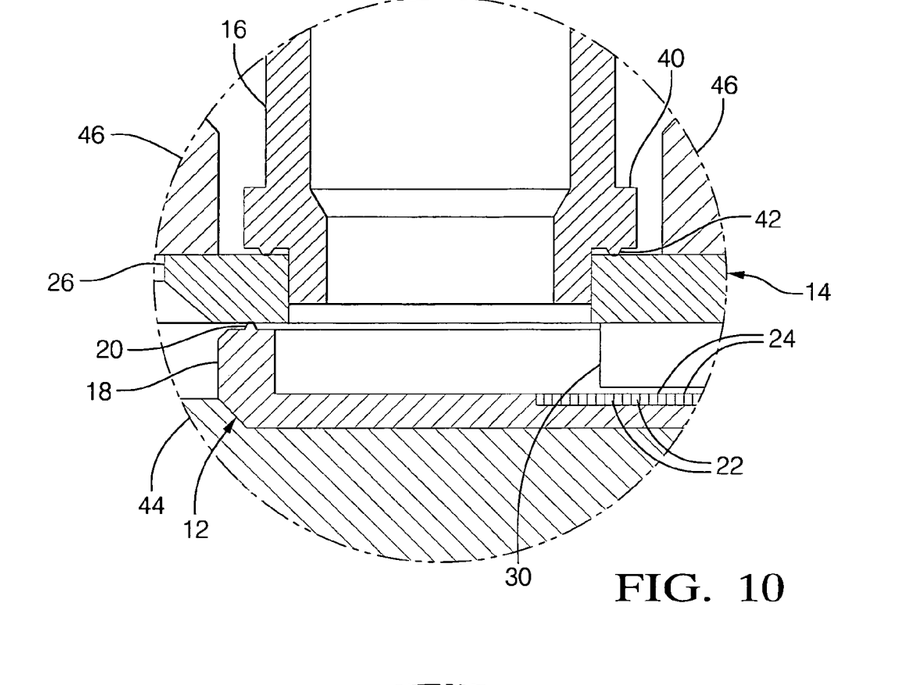
FIG. 10 is a view similar to FIG. 9, but showing the components closing up as current and clamping pressure are applied.
Figure 11:
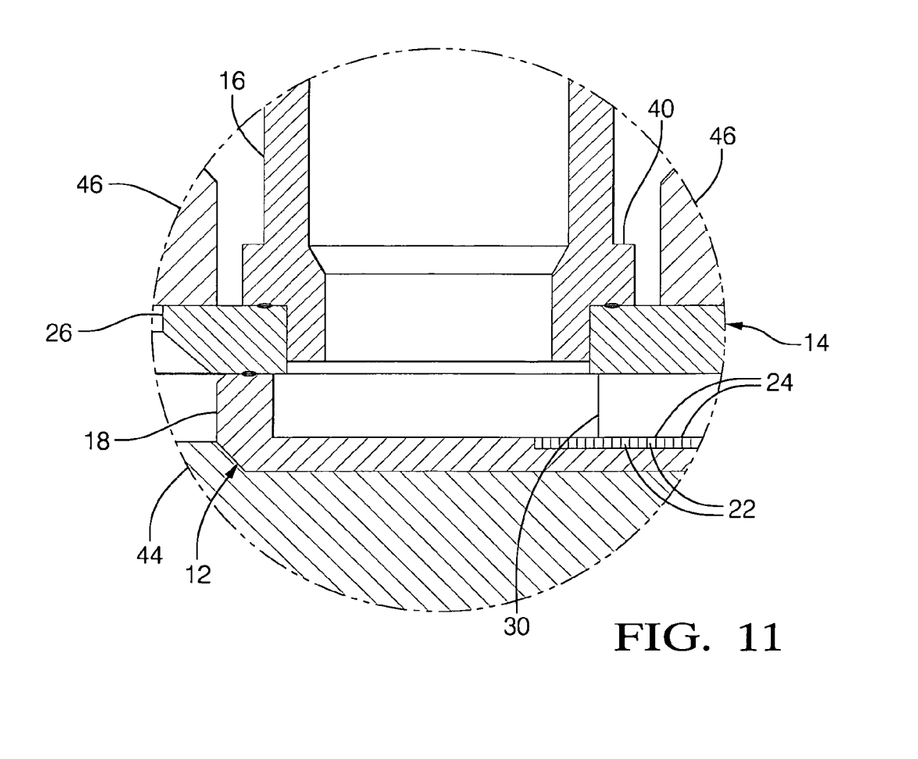
FIG. 11 is a view similar to FIG. 10, but showing the end of the welding cycle.

Referring next to FIGS. 10 and 11, as the light clamping pressure and current described above are applied, the contact resistance at the interface between the sharp edges of the two welding seams 20 and 42 and the surfaces that they engage is much higher than the resistance of the solid copper in the remainder of the components through which the current is applied. Sufficient heat is thereby generated at those interfaces to melt and or vaporize the seams 20 and 42 as the clamped components begin to move axially toward one another. The gap Delta indicated in FIG. 9 begins to close up. The components 12, 14 and 16 are prevented from moving any farther together by a hard stop once the seams 20 and 42 are fully melted. The size and shape of the seams 20 and 42 should be determined by the ultimate goal of this step in the method, that is, to provide just enough meltable and fusible material to allow for, but not interfere with, the hard stop between the component surfaces on which the seams 20 and 42, and to simultaneously provide a complete seal between those same surfaces. The melted-vaporized seams 20 and 42, since they are continuous and surround the entire perimeter of both base plate flange 18 and the cover inlet outlet pipe sockets 42, create hard seals against any external coolant leakage from the completed assembly 10, either between the plate 12 and cover 14, or through the apertures 28.

Figure 12:
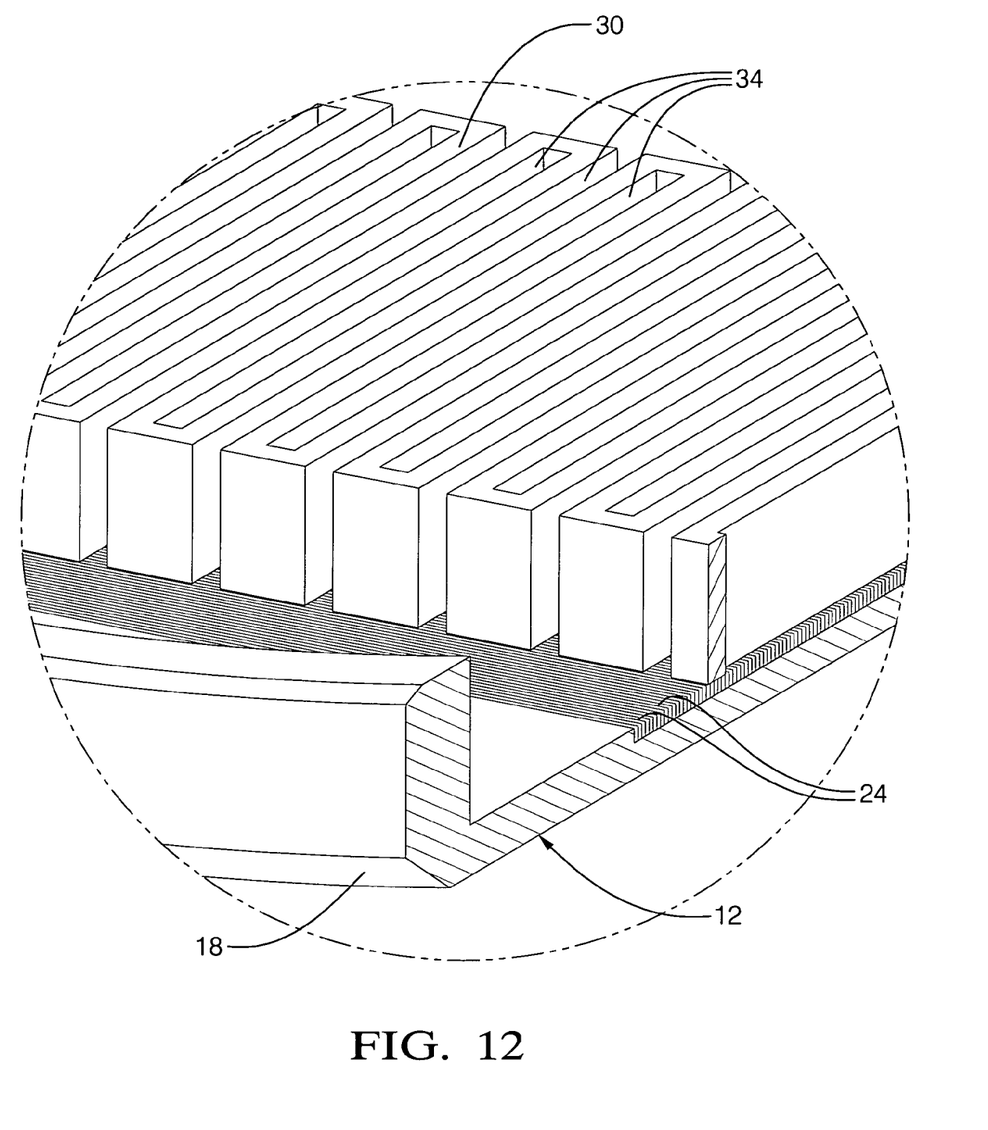
FIG. 12 is an enlarged perspective view of some of the bottom surfaces of the manifold channels crossing the top edges of the micro fins.
Figure 13:
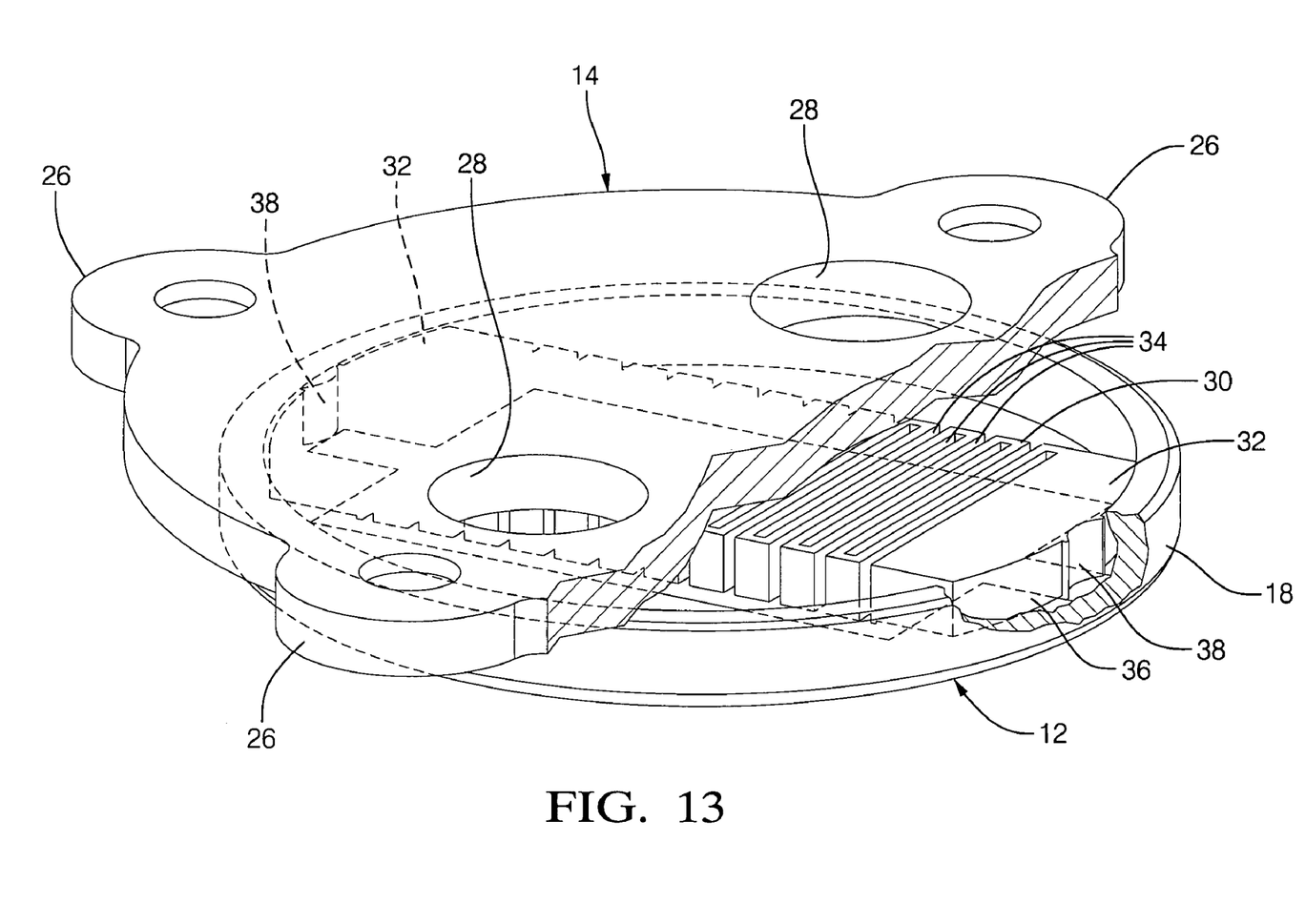
FIG. 13 is an enlarged perspective view of the undersurface of a manifold end block engaging the top edges of the central micro fins.

Referring next to FIGS. 12 and 13, another function of the melting of the welding seam 20 is illustrated. Because of the fact that the gap Delta described above is just short of the height of welding seam 20, the co planar bottom edges of the inlet-outlet channels 34 (bottom edge of the sinuous wall 30) also hit and cross the co planar top edges of the micro fins 24 just before that hard stop, that is, just before the welding seam 20 is exhausted. This is best seen in FIG. 12. At just that point, substantially all of the many interfaces created between the bottom edges of the manifold channels 34 and top edges of the crossing fins 24 create a contact resistance and heat up sufficiently to fuse. This fusion occurs quickly, since the metal is very thin at those points, and the process is designed to turn the welding current off as soon as the manifold to fin fusion occurs, either through a sensed mechanical pressure rise (hard stop), or based on cycle time, or both. Concurrently, the bottom surfaces of the sealing ribs 36 are forced into and fuse to the top edges of the elongated, central micro fins 24, and the barbed notches 38 are melted and fuse to the inner surface of the flange 18, as shown in FIG. 13. The purpose of the deliberate mechanical interference of the protruding sealing ribs 36 and barbed notches 38 is to create an assured central "dam" between the inlet and outlet sides of the manifold channels 34, that is, midway between the two inlet-outlet pipes 16.

Figure 14A:
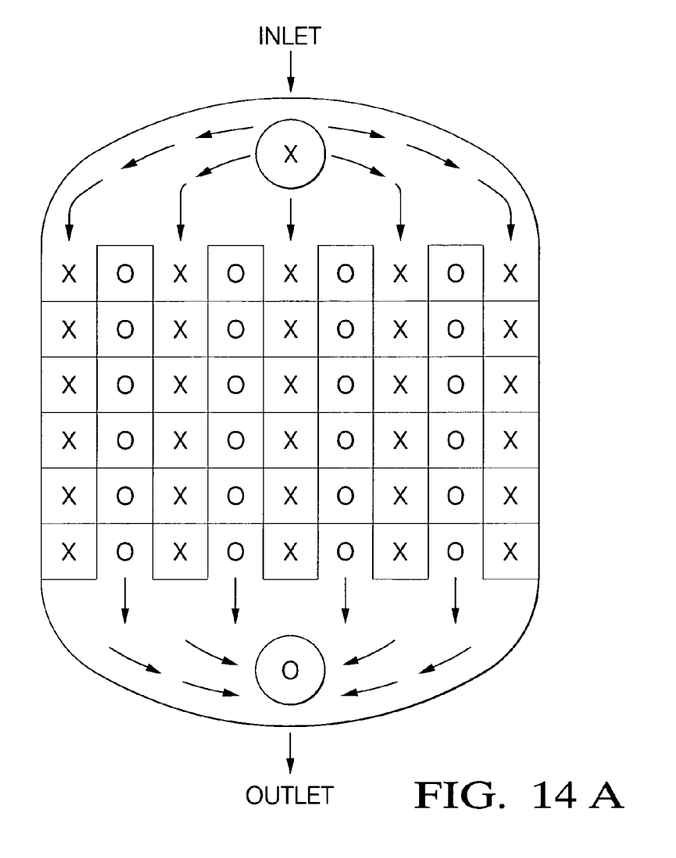
FIG. 14 is a schematic view of the flow pattern enabled by the completed cooling assembly of the invention.
Figure 14B:
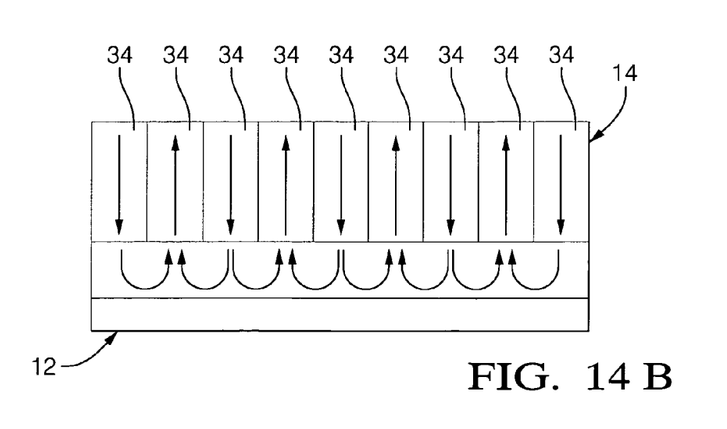

Referring next to FIG. 14, the net effect of the assured cycle end interface contacts and quick surface to surface fusions described above is to create the flow pattern illustrated in operation. The central dam created together by the sealing ribs 36 (which engage more than one elongated fin 24) and the barbed notches 38 prevents "least resistance" by pass flow that could otherwise short circuit from the inlet pipe 16 to the outlet pipe 16. Coolant is forced into the open ends of the manifold channels 34, and then down into the micro channels 22 in the regular, finely divided checkerboard pattern shown. This assures adequate flow through the channels 22, in and around the fins 24 and back up into the adjacent manifold channels 34 and out. Heat flow into the bottom of the base plate 12 from whatever heated electrical component it is in contact is efficiently removed, because of both the extreme thinness and density of the fins 24, and the regularity of the flow. Fusion at the fin 24 to manifold channel 34 interfaces is achieved without the presence of an extra material; such as adhesive of solder, and without a softer, compliant material, such as rubber, to create clogging. Even if not all of the fin 24 to manifold channel 34 interfaces are thoroughly fused, the relationship of component thicknesses described above assures at least close mechanical contact, but without significant bending or deformation of the fins 24, so that flow is still preferentially forced down and through the channels 22. Any "internal" leaks created by a less than solid fin to manifold fusion at any points are not seriously deleterious to efficiency, since by pass flow is prevented by the central dam described above, and external leaks are prevented by the continuous seams 20 and 24 surrounding all possible external leak interfaces.

Most basically, a cooling assembly created by the method of the invention will have a mutual, continuous perimeter interface created by a thin welding seam on either the base plate or the cover, the height of which temporarily maintains the controlled (and slightly smaller) gap between the top edges of the micro fins and the bottom edges of the manifold channels. The welding seam serves multiple functions, in effect, providing not only the continuous external seal, but also providing the temporary spatial gap and, as it melts, the time delay that assures the end of process, quick contact and fusion between the fins and manifold channels. Variations in the disclosed embodiment could be made. The welding seam 20 could be formed on either the manifold-cover, or on the base plate, and could continuously contact a perimeter sealing surface on the opposed component (base plate or manifold cover) to both provide a continuous external seal and to temporarily define and maintain the axial gap between manifold edges and fin edges described above. As noted, the manifold portion of the manifold-cover could be separate or integral thereto, and its alternating inlet-outlet channels could be formed in any manner that provided opposed open and closed channel ends, with lower edges lying in a plane overlaying and able to contact the co planar upper edges of the micro fins. "Upper" and "lower" are terms of convenience in that context, of course. In an embodiment where the perimeter flange and the manifold inlet-outlet channels (and inlets and outlets thereto) were formed totally integrally to and within the manifold cover, then the only action necessary to completing the cooling assembly and assuring the desired flow pattern would be to seal the perimeter between the two basic components (base plate and cover) and create a sufficiently tight interface at the crossing junctions between the inlet-outlet manifold channel edges and the micro fin-channel edges. No special provision would have to be made, like the sealing ribs and barbs shown, to prevent short circuiting flow. Therefore, it will be understood that it is not intended to limit the method of the invention to just the embodiment disclosed.

The invention claimed is:

1. A method of manufacturing a cooling assembly for a heat producing electronic component, comprising,
    providing a cold plate of electrically conductive and thermally conductive and fusible material having a lower surface adapted to be thermally bonded to said electronic component and a planar upper surface,
    forming an pattern of alternating, substantially parallel micro fins and channels of said cold plate upper surface having co planar upper edges,
    providing a manifold-cover having a series of substantially parallel, alternating inlet-outlet channels having co planar lower edges capable of being oriented over said micro fin upper edges in a crossing pattern,
    providing a thin perimeter welding seam on one of said cold plate and manifold-cover said sufficiently thin to melt when a suitable electric current is applied thereto, said welding seam being engagable with a planar surface on the other of said manifold-cover and cold plate when said cold plate and manifold cover are temporarily clamped together so as to surround said crossing pattern and having a pre determined height that maintains said manifold channel lower edges and micro fin upper edges axially spaced apart by less than said pre determined height,
    temporarily clamping said manifold-cover and cold plate together with a constant clamping force sufficient to maintain said welding seam engaged,
    applying an electric current across said clamped manifold-cover and cold plate of sufficient strength and for a sufficient time to melt said welding seam until said axial gap closes under said clamping pressure and said micro fin upper edges engage said manifold channel lower edges, thereby creating a sealed flow pattern space between said manifold channels and micro fins.

2. The method according to claim 1, further characterized in that said alternating inlet-outlet channels are provided by a sinuous wall.

3. The method according to claim 2, further characterized in that said sinuous wall is formed integrally with said manifold cover.

4. The method according to claim 1, further characterized in that said cold plate fin and channel pattern is surrounded by a substantially cylindrical flange the top edge of which has said welding seam integrally formed thereto.

5. The method according to claim 4, further characterized in that said cold plate and manifold-cover are each formed of substantially pure copper.

* * * * *